(12) United States Patent
Kuo

(10) Patent No.: US 11,631,788 B2
(45) Date of Patent: Apr. 18, 2023

(54) LIGHT-EMITTING DIODE STRUCTURE FOR IMPROVING BONDING YIELD

(71) Applicant: Lextar Electronics Corporation, Hsinchu (TW)

(72) Inventor: Shiou-Yi Kuo, Hsinchu (TW)

(73) Assignee: Lextar Electronics Corporation, Hsinchu (TW)

(*) Notice: Subject to any disclaimer, the term of this patent is extended or adjusted under 35 U.S.C. 154(b) by 56 days.

(21) Appl. No.: 17/106,204

(22) Filed: Nov. 30, 2020

(65) Prior Publication Data

US 2022/0158037 A1    May 19, 2022

(30) Foreign Application Priority Data

Nov. 18, 2020   (TW) .................................. 109140391
Nov. 25, 2020   (TW) .................................. 109141450

(51) Int. Cl.
| | | |
|---|---|---|
| *H01L 33/38* | (2010.01) | |
| *H01L 33/20* | (2010.01) | |
| *H01L 33/44* | (2010.01) | |
| *H01L 33/40* | (2010.01) | |
| *H01L 23/00* | (2006.01) | |
| *H01L 33/32* | (2010.01) | |

(52) U.S. Cl.
CPC ............ *H01L 33/387* (2013.01); *H01L 24/32* (2013.01); *H01L 33/20* (2013.01); *H01L 33/44* (2013.01); *H01L 33/32* (2013.01); *H01L 33/405* (2013.01); *H01L 2224/32104* (2013.01)

(58) Field of Classification Search
CPC ....... H01L 33/387; H01L 33/20; H01L 33/44; H01L 33/32; H01L 33/405; H01L 33/38; H01L 33/382; H01L 33/385; H01L 33/46; H01L 33/22; H01L 33/24; H01L 33/60; H01L 33/62
See application file for complete search history.

(56) References Cited

U.S. PATENT DOCUMENTS

| | | |
|---|---|---|
| 5,286,335 A | 2/1994 | Drabik et al. |
| 9,293,660 B2 | 3/2016 | Chae et al. |
| | (Continued) | |

FOREIGN PATENT DOCUMENTS

| | | |
|---|---|---|
| KR | 101691589 B1 | 1/2017 |
| TW | 201210074 A | 3/2012 |
| | (Continued) | |

*Primary Examiner* — Latanya N Crawford Eason
(74) *Attorney, Agent, or Firm* — CKC & Partners Co., LLC

(57) ABSTRACT

A light-emitting diode structure for improving bonding yield is provided, which includes a light-emitting diode, a plurality of contact electrodes, an insulating layer structure, and a plurality of bonding electrodes. One surface of the light-emitting diode includes a mesa structure. The contact electrodes are on the mesa structure. The bonding electrodes are on the insulating layer structure and respectively cover at least one contact electrode. A surface of one of the bonding electrodes facing away from the light-emitting diode has a first platform and a second platform. The second platform is on the first platform. A surface area of a vertical projection of the second platform on the light-emitting diode is smaller than that of the first platform on the light-emitting diode, and said vertical projection of the second platform is within that of the first platform.

10 Claims, 4 Drawing Sheets

(56) References Cited

U.S. PATENT DOCUMENTS

| | | | |
|---|---|---|---|
| 9,337,394 B2 | 5/2016 | Chen et al. | |
| 9,520,543 B2 | 12/2016 | Chae et al. | |
| 9,768,367 B2 | 9/2017 | Chae et al. | |
| 9,923,121 B2 | 3/2018 | Oh et al. | |
| 2018/0190871 A1* | 7/2018 | Kim | H01L 33/405 |
| 2018/0323178 A1 | 11/2018 | Meitl et al. | |

FOREIGN PATENT DOCUMENTS

| | | |
|---|---|---|
| TW | M468017 U | 12/2013 |
| TW | M468018 U | 12/2013 |
| TW | I451599 B | 9/2014 |
| TW | 201935708 A | 9/2019 |
| TW | I692115 B | 4/2020 |
| TW | 202118083 A | 5/2021 |

\* cited by examiner

LIGHT-EMITTING DIODE STRUCTURE FOR IMPROVING BONDING YIELD

RELATED APPLICATIONS

This application claims priority to Taiwan Application Serial Number 109140391, filed Nov. 18, 2020, and Taiwan Application Serial Number 109141450, filed Nov. 25, 2020, which are herein incorporated by reference.

BACKGROUND

Field of Invention

The present disclosure relates to a light-emitting diode structure for improving bonding yield.

Description of Related Art

The statements in this section merely provide background information related to the present disclosure and do not necessarily constitute prior art.

In recent years, various and new types of displays have gradually emerged. Most of these displays are developed to increase resolution and save energy. Micro light-emitting diode (μLED) is one of the important types which is now under development. The μLED shrinks the size of traditional LEDs to the order of about 100 microns or even tens of microns. Under the above order of magnitudes, the number of LEDs in the same area has increased dramatically, so the yield of LEDs transferred from the growth substrate to the display panel needs to be better than 99%. With the current process technology, there are still many technical problems regarding the mass transfer waiting to be solved. For example, the last step of the mass transfer is the bonding process, which is a key process for bonding μLEDs to the display panel. Due to the small size of μLEDs, there are limitations on bonding materials and methods, and it is a great challenge to achieve high yield.

SUMMARY

In the bonding process as mentioned above, a method that has been used is to coat an adhesive layer on the display panel first, and then use mechanical pressure to pass the μLED through the adhesive layer and form an electrical contact with a contact pad on the display panel. However, until now this method still undergoes problems related to poor contact.

In view of this, some embodiments of the present disclosure reveal a light-emitting diode structure for improving bonding yield. The light-emitting diode structure includes a light-emitting diode, a plurality of contact electrodes, an insulating layer structure, and a plurality of bonding electrodes. One surface of the light-emitting diode includes a mesa structure. The contact electrodes are on the mesa structure and separated from each other when viewed from a top view. The insulating layer structure is on the contact electrodes. The bonding electrodes are on the insulating layer structure and respectively cover at least one contact electrode. A surface of one of the bonding electrodes facing away from the light-emitting diode has a first platform and a second platform. The second platform is on the first platform and away from the mesa structure than the first platform. A vertical projection of the second platform on the light-emitting diode is smaller than a vertical projection of the first platform on the light-emitting diode, and said vertical projection of the second platform is within said vertical projection of the first platform.

In one or more embodiments of the present disclosure, the insulating layer structure is substantially conformal to surface topography of the mesa structure and the contact electrodes, and the bonding electrodes are substantially conformal to surface topography of the insulating layer structure.

In one or more embodiments of the present disclosure, the surface area of the vertical projection of the second platform on the light-emitting diode is less than about 80 square micrometers, and a surface area of the light-emitting diode extending in the same direction of a plane of said vertical projection is between about 100 square micrometers and about 10000 square micrometers.

In one or more embodiments of the present disclosure, the insulating layer structure includes a first insulating layer and a second insulating layer. The first insulating layer is in contact with and on a sidewall and an upper surface of the light-emitting diode. The first insulating layer is in contact with and on sides and surfaces of the mesa structure. The second insulating layer is on the first insulating layer and substantially conformal to the first insulating layer.

In one or more embodiments of the present disclosure, the light-emitting diode structure further includes a mirror surface conducting layer between the first insulating layer and the second insulating layer, and the mirror surface conducting layer contacts the contact electrodes.

In one or more embodiments of the present disclosure, the second insulating layer has a through hole, and one of the bonding electrodes is in contact with the mirror surface conducting layer through the through hole.

In one or more embodiments of the present disclosure, a vertical projection of the through hole on the light-emitting diode is separated from a vertical projection of the contact electrodes on the light-emitting diode.

In one or more embodiments of the present disclosure, the vertical projection of the second platform on the light-emitting diode is at least partially overlapped with the vertical projection of one of the contact electrodes on the light-emitting diode.

In one or more embodiments of the present disclosure, the light-emitting diode structure further includes a mirror surface conducting layer between the mesa structure and the insulating layer structure. The mirror surface conducting layer covers the contact electrodes.

In one or more embodiments of the present disclosure, the insulating layer structure has a through hole. One of the bonding electrodes is in contact with the mirror surface conducting layer through the through hole. A vertical projection of the through hole on the light-emitting diode is separated from the vertical projection of the contact electrodes on the light-emitting diode.

The bonding electrode of the present disclosure has benefits on both electrical connection and bonding yield improvement. With the double-layer terrace setting of the first platform and the second platform, the second platform is more bulged out and has a smaller surface area. This structure enables the light-emitting diode structure to be easier to penetrate through the adhesive layer on the bonding substrate during the bonding process and to have good electrical contact with the contact pads on the display panel and at the same time without reducing a light emission area of the light-emitting diode structure.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
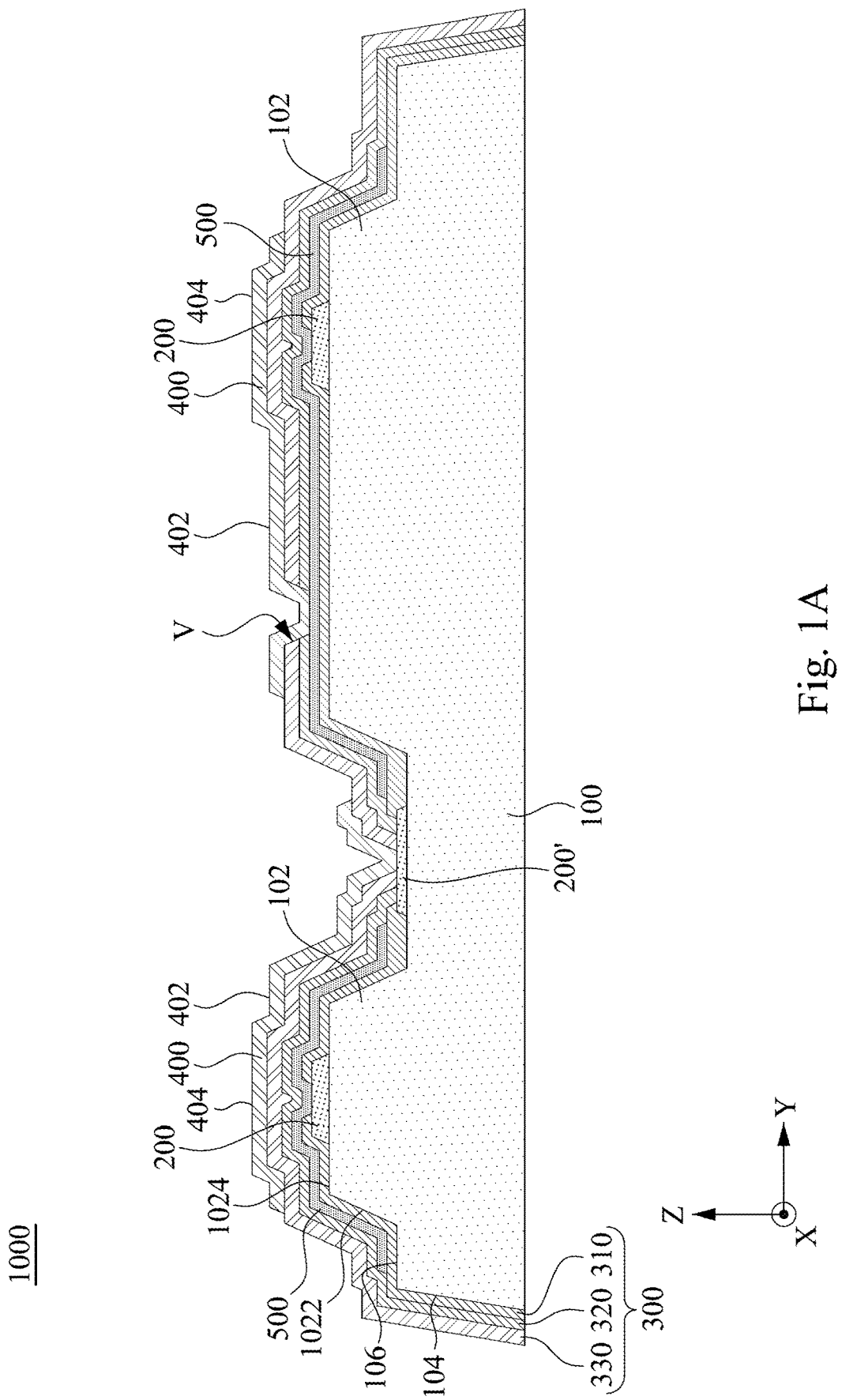
FIG. 1A is a schematic cross-sectional view of a light-emitting diode structure according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

Figure 1B:
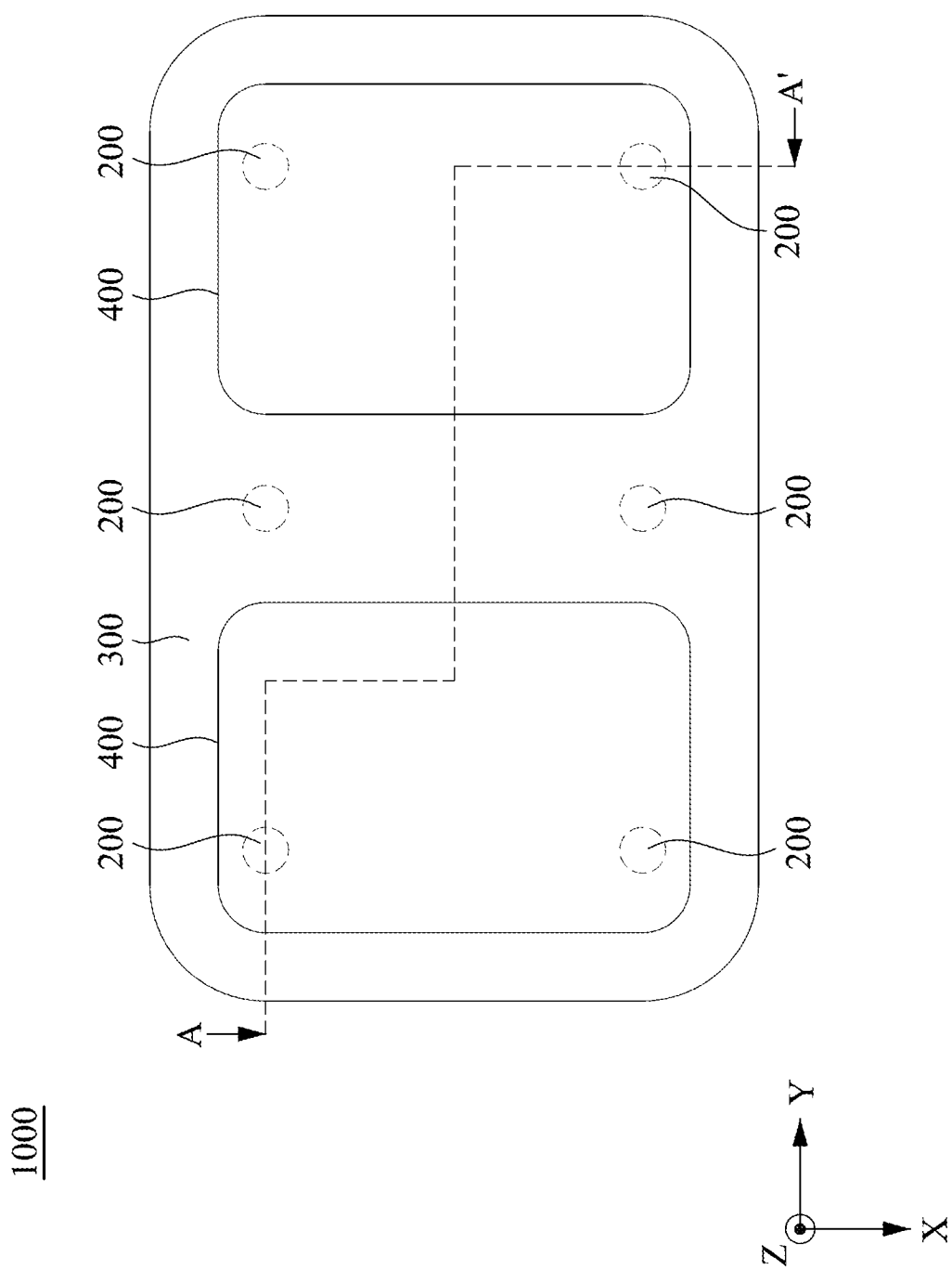
FIG. 1B is a schematic top view of the light-emitting diode structure according to some embodiments of the present disclosure.

Reference is made to FIGS. 1A and 1B. FIG. 1A is a schematic cross-sectional view of a light-emitting diode structure 1000 according to some embodiments of the present disclosure. FIG. 1B is a schematic top view of the light-emitting diode structure 1000 according to some embodiments of the present disclosure, and the dotted circles represent structures that can only be seen through perspective. A sectional line A-A' in FIG. 1B corresponds to contents illustrated in FIG. 1A. The light-emitting diode structure 1000 includes a light-emitting diode 100, a plurality of contact electrodes 200, an insulating layer structure 300, and a plurality of bonding electrodes 400. One surface of the light-emitting diode 100 includes a mesa structure 102. The light-emitting diode 100 may be a blue light-emitting structure, such as a structure based on gallium nitride (GaN); or a yellow/red light-emitting structure, such as a structure based on gallium phosphide (GaP). The light-emitting diode 100 may also be made of other common light-emitting semiconductor substrates, which will not be illustrated in details herein.

The mesa structure 102 may include N-doped semiconductor materials and P-doped semiconductor materials. When the light-emitting diode 100 is GaN-based, sides of the mesa structure 102 adjacent to the contact electrodes 200 may be P-doped GaN, and sides away from the contact electrodes 200 may be N-doped GaN. When the light-emitting diode 100 is GaP based, sides of the mesa structure 102 adjacent to the contact electrodes 200 may be N-doped aluminum gallium indium phosphide (AlGaInP), and sides away from the contact electrodes 200 can be P-doped GaP.

The contact electrodes 200 are on the mesa structure 102. When viewing from a top view of the light-emitting diode structure 1000, multiple contact electrodes 200 are separated from each other in a perspective view. The top view as mentioned refers to a viewing angle facing X-Y plane of FIG. 1A towards -Z direction. The contact electrodes 200 may be made of doped semiconductor material layers and/or metal layers. Two opposite surfaces of the doped semiconductor material layers respectively contact the metal layers and the mesa structure 102 of the light-emitting diode 100, so as to help reducing electrical resistance of electrical contact surfaces between the contact electrodes 200 and semiconductor material(s). Due to limitation of material selection, most of the contact electrodes 200 are light absorptive. Generally, structures of the contact electrodes 200 in prior arts are mostly strip-shaped or planar shaped. That is, one contact electrode 200 is used to contact one mesa structure 102 having a large area. In contrast, the contact electrodes 200 described in the embodiments of the present disclosure as mentioned are a plurality of small-area electrodes (as shown in FIG. 1B) above the mesa structure 102. Under this configuration, not only the light absorption of the contact electrodes 200 can be reduced, but also a subsequent double-layer terrace structure made by the bonding electrode 400 can be more easily formed.

The insulating layer structure 300 is on the contact electrodes 200. The bonding electrodes 400 are on the insulating layer structure 300 and respectively cover at least one of the plurality of contact electrodes 200 as mentioned. Surfaces of bonding electrodes 400 facing away from the light-emitting diode 100 respectively have a first platform 402 and a second platform 404. The second platform 404 is on the first platform 402 and is away from the mesa structure 102 than the first platform 402. A surface area of a vertical projection of the second platform 404 on the light-emitting diode 100 is smaller than a surface area of a vertical projection of the first platform 402 on the light-emitting diode 100. The vertical projection of the second platform 404 as mentioned is within the vertical projection of the first platform 402 as mentioned. With the setting of the first platform 402 and the second platform 404 as mentioned above, the quality of contact surfaces between the light-emitting diode structure 1000 and a substrate of bonding target in a final bonding process of transfer processes can be improved, and the success rate of the bonding process can be increased. The reason is that the second platform 404 has a smaller surface area. That is, the second platform 404 is more bulged out. Therefore, during the transfer processes, an adhesive layer can be penetrated (squeezed aside) better by the structure of the second platform 404 and the second platform 404 is bonded with the substrate of the transfer target. A schematic diagram of this part will be shown later in FIG. 3. In some embodiments, the first platform 402 and the second platform 404 are formed into a unitary piece, and can be formed within a single process (e.g., a metal coating process). In some embodiments, the insulating layer structure 300 is substantially conformal to surface topography of the mesa structure 102, and is conformal to surface topography of each of the contact electrodes 200. The bonding electrodes 400 are substantially conformal to surface topography of the insulating layer structure 300. In the embodiments as mentioned, due to the existence of the first platform 402, there is no need to reduce a size of the mesa structure 102 to match a surface area of the second platform 404, so that quality of the contact surfaces can be improved and without reducing the area of a light-emitting layer (active layer) in the mesa structure 102.

In some embodiments, the vertical projection of the second platform 404 on the light-emitting diode 100 is at least partially overlapped with the vertical projection of the contact electrodes 200 on the light-emitting diode 100. In other words, the structure of the second platform 404 is directly above (in +Z direction of) the contact electrodes 200, that is, directly above (in +Z direction of) the mesa structure 102. Such an arrangement can make the formation of the double-layer terrace structure (e.g., the structure of the first platform 402 and the second platform 404 described in the embodiments) easier, and more economical in using materials. In some embodiments, the surface area of the vertical projection of the second platform 404 on the light-emitting diode 100 is less than about 80 square micrometers. A surface area of the light-emitting diode 100 extending in the same direction of a plane of the vertical projection as mentioned (i.e., the extending direction of X-Y plane as shown in FIG. 1A) is between about 100 square micrometers and about 10000 square micrometers. Under the condition of the surface areas as mentioned, the bonding process as mentioned can achieve better electrical contact quality with the target substrate.

In some embodiments, the insulating layer structure 300 includes a first insulating layer 310 and a second insulating layer 320. The first insulating layer 310 is in contact with and on a sidewall 104 and an upper surface 106 of the light-emitting diode 100 and on a side 1022 and a surface 1024 of the mesa structure 102. The second insulating layer 320 is on the first insulating layer 310 and is substantially conformal to the first insulating layer 310. In some embodiments, the insulating layer structure 300 further includes a third insulating layer 330 on the second insulating layer 320 and substantially conformal to the second insulating layer 320. The first insulating layer 310, the second insulating layer 320, and the third insulating layer 330 may be insulating layers formed by atomic layer deposition (ALD).

In some embodiments, the light-emitting diode structure 1000 further includes a mirror surface conducting layer 500 between the first insulating layer 310 and the second insulating layer 320. The mirror surface conducting layer 500 is in contact with multiple contact electrodes 200 as mentioned. The mirror surface conducting layer 500 has an area which is much greater than the contact electrodes 200 in the extending direction along X-Y plane, so as to spread and guide currents to be injected into each of the contact electrodes 200, and to increase the current uniformity of the light-emitting diode 100 in the extending direction along X-Y plane to improve luminous efficiency. In some embodiments, the second insulating layer 320 and/or the third insulating layer 330 has through holes V (i.e., through holes V are formed in the second insulating layer 320 and/or the third insulating layer 330). At least one of the bonding electrodes 400 is in contact with the mirror surface conducting layer 500 through the through holes V.

In addition, in order to better spread and increase the uniformity of the currents, vertical projections of the through holes V on the light-emitting diode 100 is separated from a vertical projection of the contact electrodes 200 on the light-emitting diode 100. In other words, the through holes V are not directly above (in +Z direction of) the contact electrodes 200, which can make the currents injected into the mirror surface conducting layer 500 from the through holes V spread laterally to multiple contact electrodes 200 and then enter the semiconductor layer of the light-emitting diode 100 to achieve the effect of current spreading. In addition, the setting of the mirror surface conducting layer 500 can also reflect light emitted from the light-emitting diode 100, so as to increase the light extraction rate in −Z direction. The mirror surface conducting layer 500 may be conformal with the mesa structure 102, and covers the side 1022 and the upper surface 106 to achieve a better light reflection effect. The mirror surface conducting layer 500 may be made of silver (Ag), but should not be limited thereto.

Figure 2:
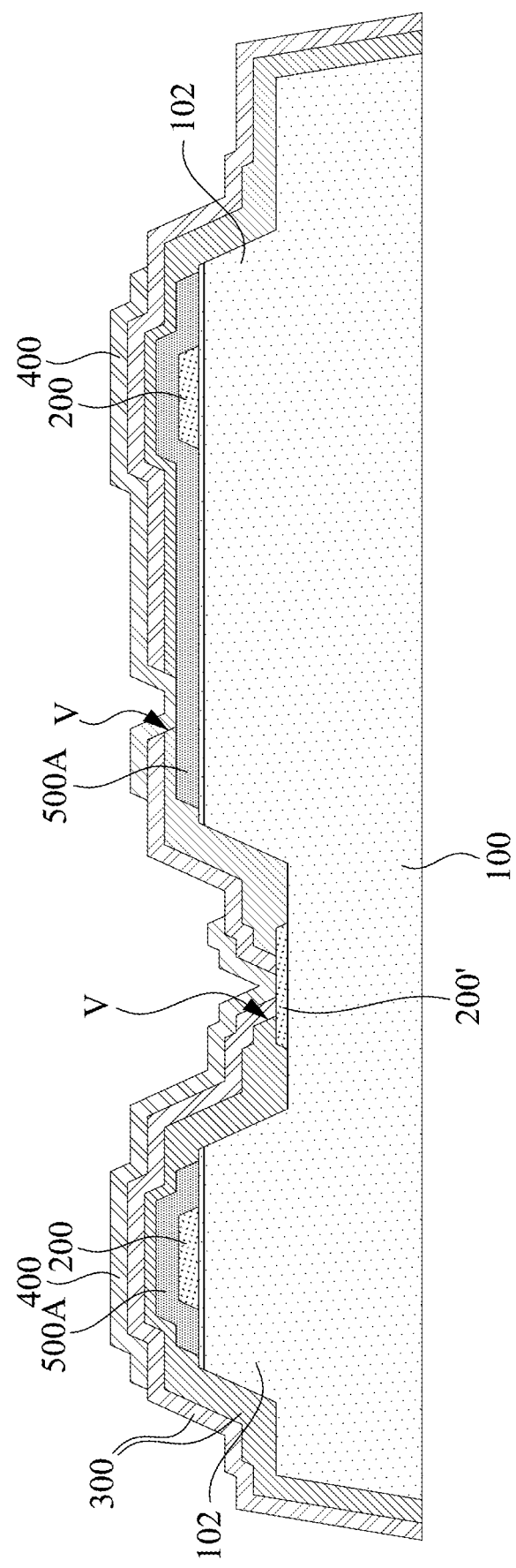
FIG. 2 is a schematic cross-sectional view of a light-emitting diode structure according to some embodiments of the present disclosure.

Reference is made to FIG. 2. FIG. 2 is a schematic cross-sectional view of a light-emitting diode structure 1000A according to some embodiments of the present disclosure. In some embodiments, the mirror surface conducting layer 500A is between the mesa structure 120 and the insulating layer structure 300. The mirror surface conducting layer 500A covers and in contact with the contact electrodes 200 as mentioned. In some embodiments, the mirror surface conducting layer 500A is entirely above the mesa structure 102, and the entire surface of the mirror surface conducting layer 500A is in contact with and covers the surface 1024 of the mesa structure 102 and the contact electrodes 200. With the large-area electrical contact as mentioned, improvement on current spreading can be achieved. Definitely, a conductive layer (e.g., an indium tin oxide (ITO) film) may also be provided between the mirror surface conducting layer 500A and the mesa structure 102, which can also achieve the uniform current effect. In the embodiments as shown in FIG. 2, the insulating layer structure 300 has through holes V. At least one bonding electrode 400 contacts the mirror surface conducting layer 500A through one through hole V, and a vertical projections of the through holes V on the light-emitting diode 100 is separated from the vertical projection of the contact electrodes 200 on the light-emitting diode 100. In some embodiments, the bonding electrodes 400 may contact the semiconductor material of the light-emitting diode 100 through the through holes V, or contact the semiconductor material of the light-emitting diode 100 via a contact electrode 200', which provide multiple electrical contact points and make better current spreading effect.

Figure 3:
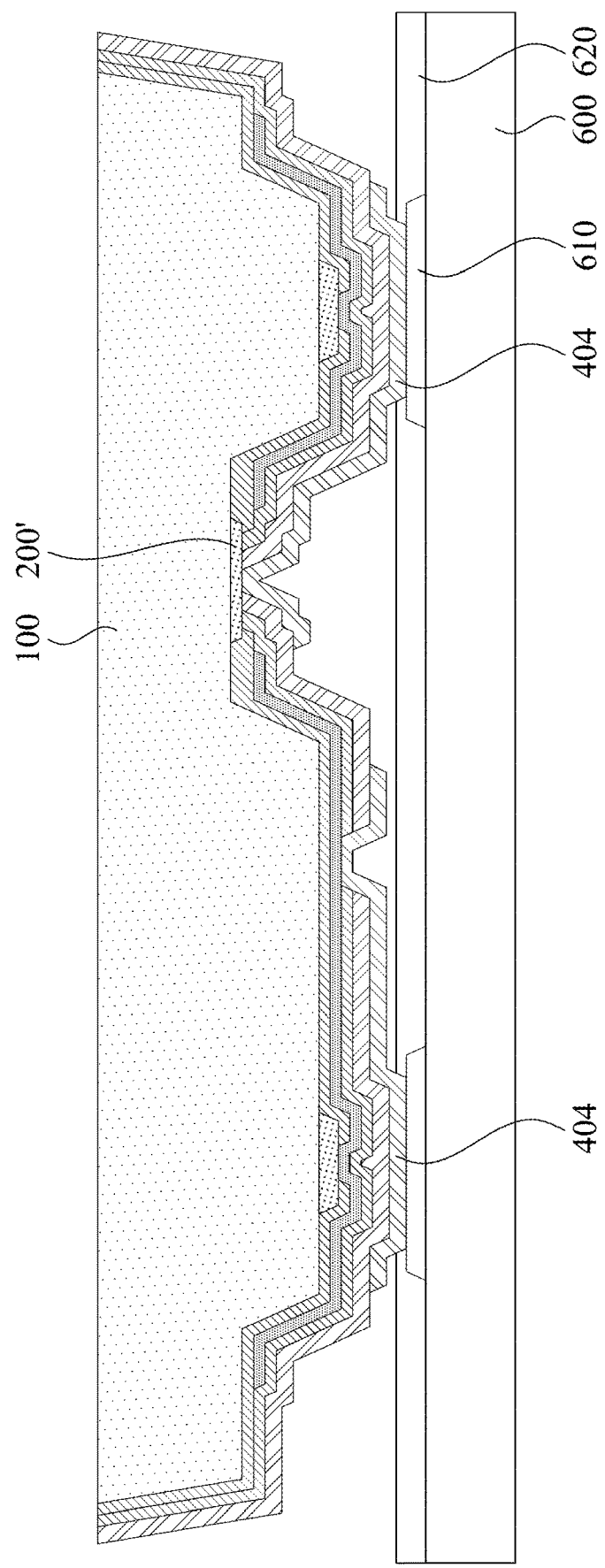
FIG. 3 is a schematic cross-sectional view of the light-emitting diode structure bonded to a display panel according to some embodiments of the present disclosure.

Reference is made to FIG. 3. FIG. 3 is a schematic cross-sectional view of the light-emitting diode structure 1000 bonded to a display panel 600 according to some embodiments of the present disclosure. As mentioned before, the structure of the first platform 402 and the second platform 404 of the light-emitting diode structure 1000 can improve the electrical contact quality after the bonding process. FIG. 3 is a schematic diagram after the bonding process is completed. In some embodiments, pressure is applied to the light-emitting diode structure 1000 and/or the display panel 600, so that the second platform 404 penetrates and squeezes aside an adhesive layer 620 (e.g., polymethyl methacrylate, PMMA, but should not be limited thereto) on the display panel 600, and is in surface contact with a contact pad 610 on the display panel 600. Through the setting of the two-layer terraces as described in many embodiments herein, and through area sizes and positional relationship on X-Y plane between the first platform 402 and the second platform 404, it becomes easier for the second platform 404 to squeeze aside the adhesive layer 620 and produces better electrical contact with the contact pad 610, which improves the process yield.

In summary, the embodiments of the present disclosure provide a light-emitting diode structure that improves the bonding yield. With the setting of the double-layer terrace constructed by the first platform and the second platform, the second platform is more bulged out and has a smaller surface area. The structure enables the light-emitting diode structure to penetrate through the adhesive layer on the bonding substrate easier during the bonding process and to have good electrical contact with the contact pads on the display panel, and at the same time without reducing a light emission area of the light-emitting diode structure. In addition, the setting of the mirror surface conducting layer further improves the current spreading effect in the light-emitting diode and the light extraction rate of the light-emitting diode.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A light-emitting diode structure for improving bonding yield, comprising:
    a light-emitting diode, and one surface of the light-emitting diode comprises a mesa structure;
    a plurality of contact electrodes on the mesa structure and separated from each other when viewed from a top view;
    an insulating layer structure on the contact electrodes; and
    a plurality of bonding electrodes on the insulating layer structure and respectively covering at least one of the contact electrodes, a surface of one of the bonding electrodes facing away from the light-emitting diode having a first platform and a second platform, the second platform being on the first platform and away from the mesa structure than the first platform, a surface area of a vertical projection of the second platform on the light-emitting diode is smaller than a surface area of a vertical projection of the first platform on the light-emitting diode, and said vertical projection of the second platform is within said vertical projection of the first platform,
    wherein the insulating layer structure comprises a first insulating layer and a second insulating layer, the first insulating layer is in contact with and on a sidewall and an upper surface of the light-emitting diode, and sides and surfaces of the mesa structure, and the second insulating layer is on the first insulating layer and is substantially conformal to the first insulating layer,
    wherein the light-emitting diode further comprises a mirror surface conducting layer that is interposed directly between the first insulating layer and the second insulating layer, and the mirror surface conducting layer contacts the contact electrodes,
    wherein the second insulating layer has a through hole, and one of the bonding electrodes is in contact with the mirror surface conducting layer through the through hole,
    wherein a vertical projection of the through hole on the light-emitting diode is separated laterally from all of vertical projections of the contact electrodes on the light-emitting diode.

2. The light-emitting diode structure of claim 1, wherein the insulating layer structure is substantially conformal to surface topography of the mesa structure and the contact electrodes, and the bonding electrodes are substantially conformal to surface topography of the insulating layer structure.

3. The light-emitting diode structure of claim 1, wherein the surface area of the vertical projection of the second platform on the light-emitting diode is less than about 80 square micrometers, and a surface area of the light-emitting diode extending in the same direction of a plane of said vertical projection is between about 100 square micrometers and about 10000 square micrometers.

4. The light-emitting diode structure of claim 1, wherein the vertical projection of the second platform on the light-emitting diode is at least partially overlapped with the vertical projection of one of the contact electrodes on the light-emitting diode.

5. A light-emitting diode structure for improving bonding yield, comprising:
    a light-emitting diode, and one surface of the light-emitting diode comprises a mesa structure;
    a plurality of contact electrodes on the mesa structure and separated from each other when viewed from a top view;
    an insulating layer structure on the contact electrodes; and
    a plurality of bonding electrodes on the insulating layer structure and respectively covering at least one of the contact electrodes, a surface of one of the bonding electrodes facing away from the light-emitting diode having a first platform and a second platform, the second platform being on the first platform and away from the mesa structure than the first platform, a surface area of a vertical projection of the second platform on the light-emitting diode is smaller than a surface area of a vertical projection of the first platform on the light-emitting diode, and said vertical projection of the second platform is within said vertical projection of the first platform,
    wherein the light-emitting diode further comprises a mirror surface conducting layer interposed in the insulating layer structure and contacting the contact electrodes,
    wherein the insulating layer structure has a through hole, one of the bonding electrodes is in contact with the mirror surface conducting layer through the through hole, and a vertical projection of the through hole on the light-emitting diode is separated laterally from all of vertical projections of the contact electrodes on the light-emitting diode.

6. The light-emitting diode structure of claim 5, wherein the insulating layer structure is substantially conformal to surface topography of the mesa structure and the contact electrodes, and the bonding electrodes are substantially conformal to surface topography of the insulating layer structure.

7. The light-emitting diode structure of claim 5, wherein the surface area of the vertical projection of the second platform on the light-emitting diode is less than about 80 square micrometers, and a surface area of the light-emitting diode extending in the same direction of a plane of said vertical projection is between about 100 square micrometers and about 10000 square micrometers.

8. The light-emitting diode structure of claim 5, wherein the insulating layer structure comprises a first insulating layer and a second insulating layer, the first insulating layer is in contact with and on a sidewall and an upper surface of the light-emitting diode, and sides and surfaces of the mesa structure, and the second insulating layer is on the first insulating layer and is substantially conformal to the first insulating layer.

9. The light-emitting diode structure of claim 8, wherein the mirror surface conducting layer is interposed between the first insulating layer and the second insulating layer.

10. The light-emitting diode structure of claim 5, wherein the vertical projection of the second platform on the light-emitting diode is at least partially overlapped with the vertical projection of one of the contact electrodes on the light-emitting diode.

* * * * *